(12) United States Patent
Yazawa

(10) Patent No.: US 10,340,128 B2
(45) Date of Patent: Jul. 2, 2019

(54) APPARATUS, METHOD AND NONTRANSITORY COMPUTER READABLE MEDIUM FOR MANUFACTURING INTEGRATED CIRCUIT DEVICE

(71) Applicant: Toshiba Memory Corporation, Minato-ku (JP)

(72) Inventor: Hiroyuki Yazawa, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 14/846,109

(22) Filed: Sep. 4, 2015

(65) Prior Publication Data

US 2017/0018469 A1    Jan. 19, 2017

Related U.S. Application Data

(60) Provisional application No. 62/193,193, filed on Jul. 16, 2015.

(51) Int. Cl.

| | |
|---|---|
| *H01L 21/3065* | (2006.01) |
| *H01J 37/32* | (2006.01) |
| *H01L 27/11568* | (2017.01) |
| *H01L 21/67* | (2006.01) |
| *H01L 27/11582* | (2017.01) |
| *H01L 21/311* | (2006.01) |
| *H01L 49/02* | (2006.01) |

(52) U.S. Cl.
CPC .. *H01J 37/32963* (2013.01); *H01J 37/32972* (2013.01); *H01L 21/31116* (2013.01); *H01L 21/67069* (2013.01); *H01L 21/67253* (2013.01); *H01L 27/11568* (2013.01); *H01L 27/11582* (2013.01); *H01L 28/00* (2013.01); *H01J 2237/334* (2013.01)

(58) Field of Classification Search
CPC ... H01L 22/20; H01L 22/12; H01L 27/11568; H01L 21/3065; H01L 21/67069; H01L 27/11582; H01L 28/00; H01L 21/67253; H01L 21/31116; H01J 37/32963; H01J 37/32972; H01J 2237/334
See application file for complete search history.

(56) References Cited

U.S. PATENT DOCUMENTS

| | | |
|---|---|---|
| 6,613,683 B2 | 9/2003 | Hwangbo et al. |
| 6,756,311 B2 | 6/2004 | Suzuki |
| 7,695,984 B1 | 4/2010 | Monkowski et al. |

(Continued)

FOREIGN PATENT DOCUMENTS

| | | | |
|---|---|---|---|
| JP | 2-307003 A | | 12/1990 |
| JP | 05179467 A | * | 7/1993 |
| JP | 7-263645 A | | 10/1995 |

*Primary Examiner* — Yuechuan Yu
(74) *Attorney, Agent, or Firm* — Oblon, McClelland, Maier & Neustadt, L.L.P.

(57) ABSTRACT

According to one embodiment, a manufacturing apparatus for an integrated circuit device includes an etching treatment unit, a sensor, and a control unit. The etching treatment unit etches a stacked body including an alternately arranged plurality of films having different compositions. The sensor detects light intensity in the etching. The control unit acquires data concerning a temporal change in the light intensity detected by the sensor and performs control of the etching based on a time interval of a plurality of extreme values of the data.

5 Claims, 8 Drawing Sheets

(56) References Cited

U.S. PATENT DOCUMENTS

2003/0016346 A1\* 1/2003 Umeda ................ C23C 14/546
　　　　　　　　　　　　　　　　　　　　　　356/72
2005/0194095 A1\* 9/2005 Usui ................ H01J 37/32972
　　　　　　　　　　　　　　　　　　　　　　156/345.28

\* cited by examiner

APPARATUS, METHOD AND NONTRANSITORY COMPUTER READABLE MEDIUM FOR MANUFACTURING INTEGRATED CIRCUIT DEVICE

CROSS-REFERENCE TO RELATED APPLICATIONS

This application is based upon and claims the benefit of priority from U.S. Provisional Patent Application 62/193,193, filed on Jul. 16, 2015; the entire contents of which are incorporated herein by reference.

FIELD

Embodiments described herein relate generally to an apparatus, a method and a nontransitory computer readable medium for manufacturing an integrated circuit device.

BACKGROUND

There has been developed an integrated circuit device of a three-dimensional stacked type including memory cells stacked three-dimensionally. In manufacturing of the integrated circuit device, holes and lines with a high aspect ratio are formed. It is demanded to suppress fluctuation in sizes of the holes and the lines. It is demanded to suppress fluctuation in a processing amount in a lower layer (e.g., a substrate) of a stacked film to be processed.

DETAILED DESCRIPTION

According to one embodiment, a manufacturing apparatus for an integrated circuit device includes an etching treatment unit, a sensor, and a control unit. The etching treatment unit etches a stacked body including an alternately arranged plurality of films having different compositions. The sensor detects light intensity in the etching. The control unit acquires data concerning a temporal change in the light intensity detected by the sensor and performs control of the etching based on a time interval of a plurality of extreme values of the data.

Various embodiments will be described hereinafter with reference to the accompanying drawings.

an example of a manufacturing apparatus for an integrated circuit device according to an embodiment is described.

Figure 1:
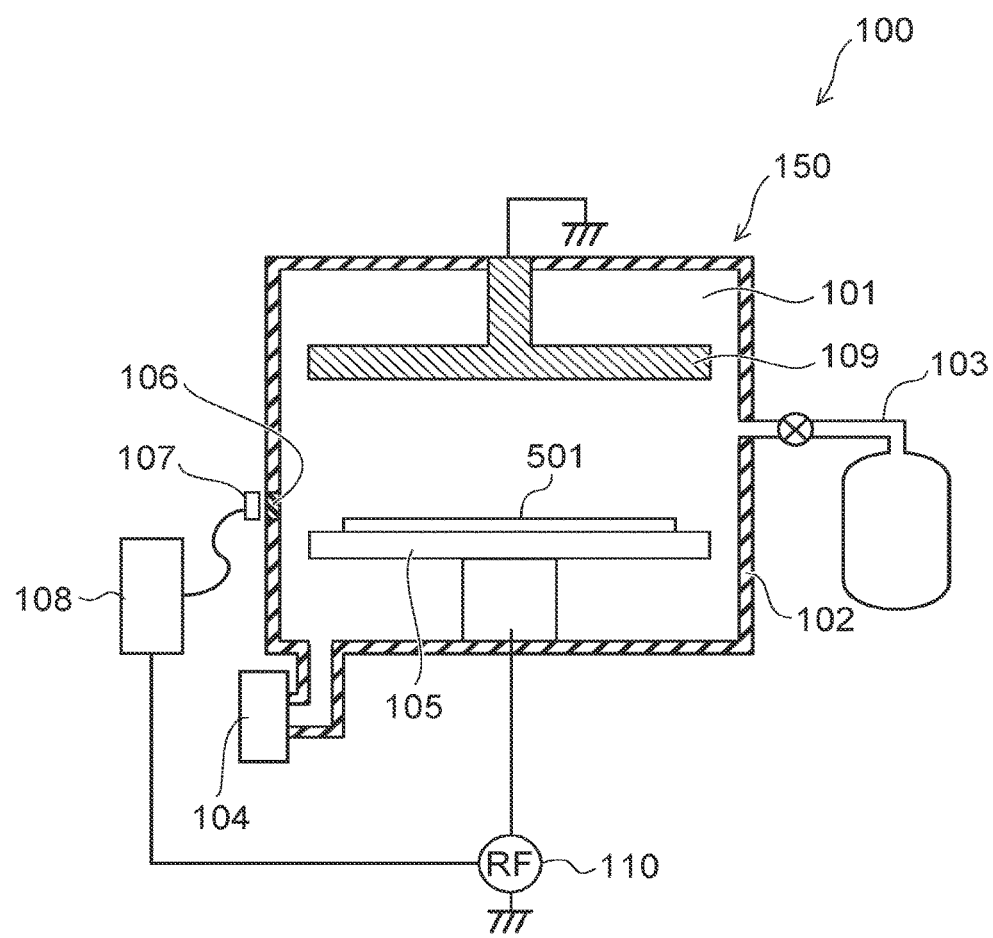
FIG. 1 is a perspective view illustrating the manufacturing apparatus for the integrated circuit device according to the embodiment.

FIG. 1 is a perspective view illustrating the manufacturing apparatus for the integrated circuit device according to the embodiment.

As shown in FIG. 1, in a manufacturing apparatus 100 for the integrated circuit according to the embodiment, an etching treatment unit 150, a photosensor 107, and a control unit 108 are provided.

The control unit 108 is realized as, for example, a manufacturing program for the integrated circuit device. That is, the control unit 108 is also realized by using a general-purpose computer apparatus as basic hardware. A function of the control unit 108 can be realized by causing a processor mounted on the computer apparatus to execute the manufacturing program for the integrated circuit device. In this case, the control unit 108 may be realized by installing the manufacturing program for the integrated circuit device in the computer apparatus in advance or may be realized by storing the manufacturing program for the integrated circuit device in a recording medium such as a CD-ROM or distributing the manufacturing program for the integrated circuit device via a network and installing the manufacturing program for the integrated circuit device in the computer apparatus as appropriate. The control unit 108 can be realized using a memory or a hard disk incorporated in or externally attached to the computer apparatus or a recording medium such as a CD-R, a CD-RW, a DVD-RAM, or a DVD-R as appropriate.

The etching treatment unit 150 includes a housing 102 that defines a treatment chamber 101, a gas supply system 103 that supplies an etching gas to the treatment chamber 101, a pump 104 that exhausts gas in the treatment chamber 101, a high-frequency source 110, a holding table 105 provided in the treatment chamber 101, and a dielectric plate 109 provided on the holding table 105.

The holding table 105 holds, for example, a substrate 501. The dielectric plate 109 is provided on the upper wall of the housing 102. The dielectric plate 109 is, for example, grounded.

The substrate 501 has a first surface in contact with the holding table 105 and a second surface, which is the rear surface of the first surface. The substrate 501 is, for example, a silicon wafer.

The holding table 105 is disposed on the lower wall of the housing 102. The holding table 105 includes a portion in contact with the substrate 501. The dielectric plate 109 is opposed to the portion of the holding table 105. The holding table 105 is connected to the high-frequency source 110. The high-frequency source 110 is connected to the control unit 108 as well.

A window 106 is provided in the housing 102. The substrate 501 (e.g., the second surface) can be monitored through the window 106, for example, from the outside of the housing 102.

the photosensor 107 is opposed to the window 106. The control unit 108 is provided, for example, outside the housing 102. The control unit 108 is connected to the photosensor 107.

the photosensor 107 detects, for example, the intensity of light in a predetermined wavelength region (wavelength width). For example, the photosensor 107 measures light intensity of approximately 390 nm (e.g., 385 nm or more and 395 nm or less). The photosensor 107 may measure, for example, light intensity of light including 390 nm (e.g., light having wavelength of 380 or more and 400 nm or less). The photosensor 107 detects, for example, light emission intensity during etching treatment.

The control unit 108 acquires data of the light emission intensity detected by the photosensor 107 during the etching treatment. The control unit 108 derives an estimated time to an end point in the etching treatment on the basis of the data of the light emission intensity acquired from the photosensor 107.

The control unit 108 acquires data concerning a temporal change in the light intensity detected by the photosensor 107. The control unit 108 detects a plurality of extreme values of the acquired data. The control unit 108 derives the estimated time to the end point on the basis of a time interval of the plurality of extreme values. The control unit 108 controls the etching treatment unit 150 on the basis of the derived estimated time. For example, the control unit 108 causes the etching treatment unit 150 to ends the etching treatment on the basis of the estimated time to the end point. An example of the operation of the control unit 108 is described below.

an example of a manufacturing method for the integrated circuit device according to the embodiment is described.

FIG. 2 to FIG. 8 are process sectional views illustrating the manufacturing method for the integrated circuit device according to the embodiment.

Figure 9:
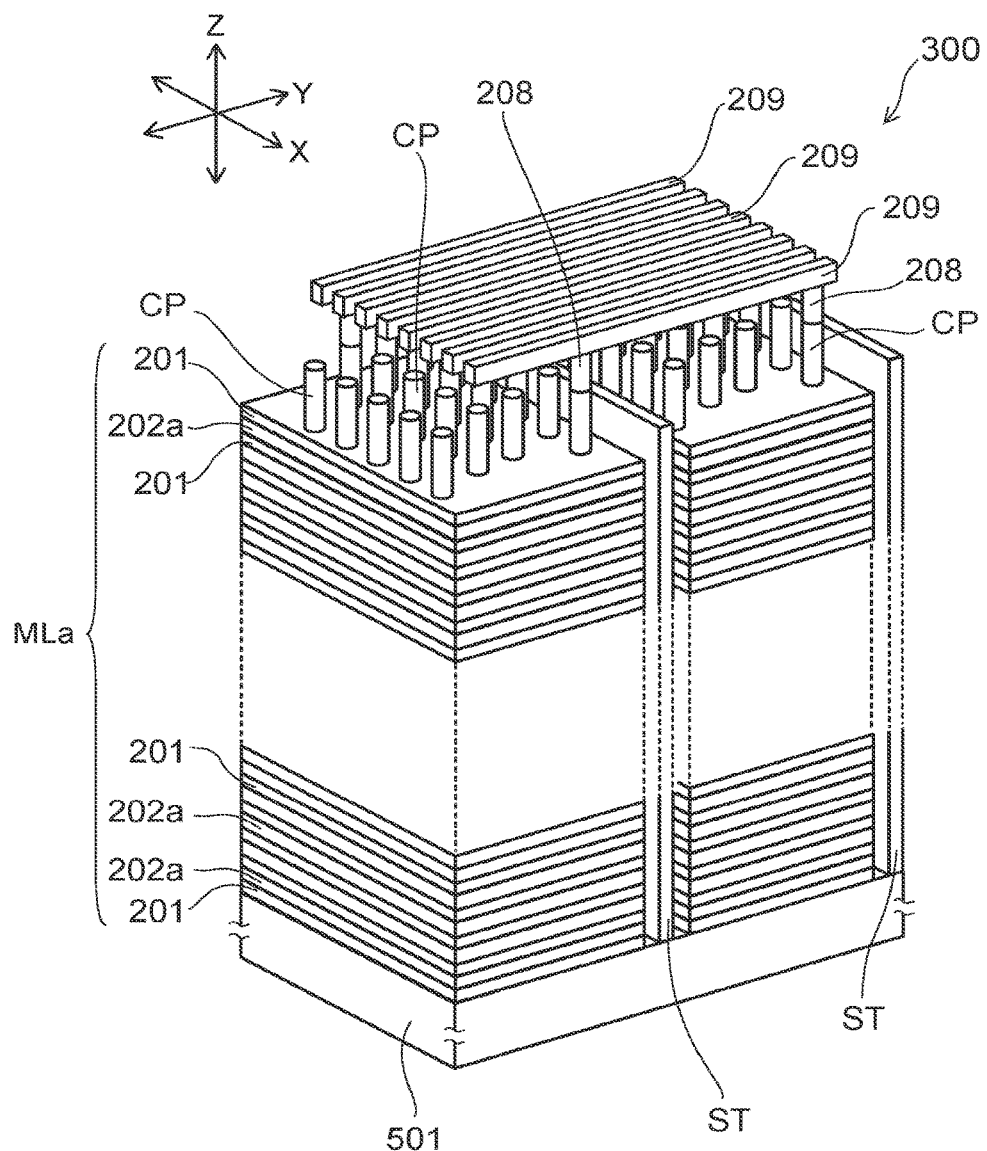
FIG. 9 is a perspective view illustrating the integrated circuit device.

FIG. 9 is a perspective view illustrating the integrated circuit device.

Figure 2:
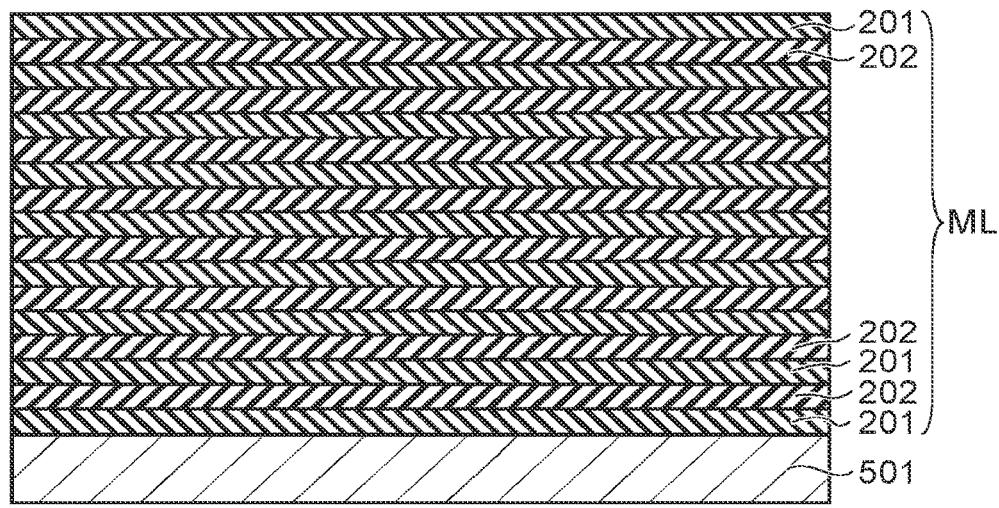
FIGS. 2 to 8 are process sectional views illustrating the manufacturing method for the integrated circuit device according to the embodiment.

As shown in FIG. 2, a plurality of insulating films 201 and a plurality of first films 202 are alternately stacked on the substrate 501. As the insulating films 201 and the first films 202, materials having compositions different from each other are used. Consequently, a stacked body ML including an alternately arranged plurality of films having the different compositions is formed on the substrate 501. As the insulating films 201, for example, an insulating material such as silicon oxide is used. As the first films 202, for example, a material containing silicon nitride is used. As the first films 202, for example, a material containing polysilicon may be used.

The thickness (insulating film thickness) of each of the plurality of insulating films 201 is length along a stacking direction. A plurality of insulating film thicknesses may be different from one another. The plurality of insulating film thicknesses may change along the stacking direction. For example, the plurality of insulating film thicknesses may change at a fixed rate along the stacking direction (every time a film is stacked). The thickness (first film thickness) of each of the plurality of first films 202 is length along the stacking direction. A plurality of first film thicknesses may be different from one another. The plurality of first film thicknesses may change along the stacking direction. For example, the plurality of first film thicknesses may change at a fixed rate along the stacking direction (every time a film is stacked). The thickness of each of the insulating films 201 and the first films 202 may be able to be grasped. In this case, each of the films may be formed at predetermined thickness.

Figure 3:
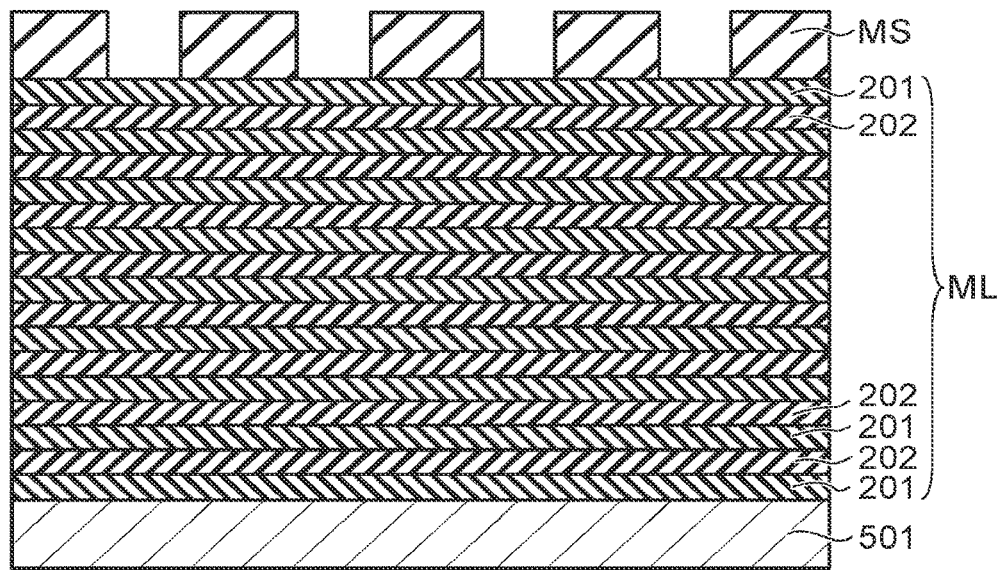

As shown in FIG. 3, resist patterns MS are formed on the stacked body ML. The resist patterns MS are formed by processing a resist film formed on the stacked body ML. The formation of the resist films is performed by, for example, a photolithography method.

For example, a resist film such as a CVD-C film is formed on the stacked body ML. Further, an inorganic film is formed on the resist film. The inorganic film is processed into predetermined patterns by photolithography. Thereafter, the resist film is processed by anisotropic etching such as RIE (Reactive Ion Etching) using the inorganic film as a mask. Consequently, the resist patterns MS are formed.

Figure 4:
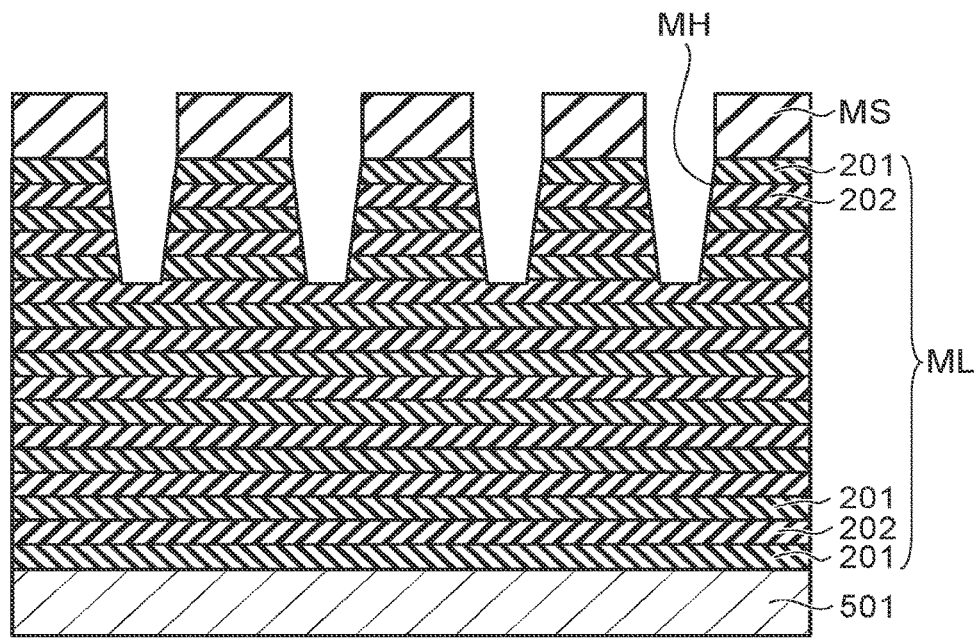
Figure 5:
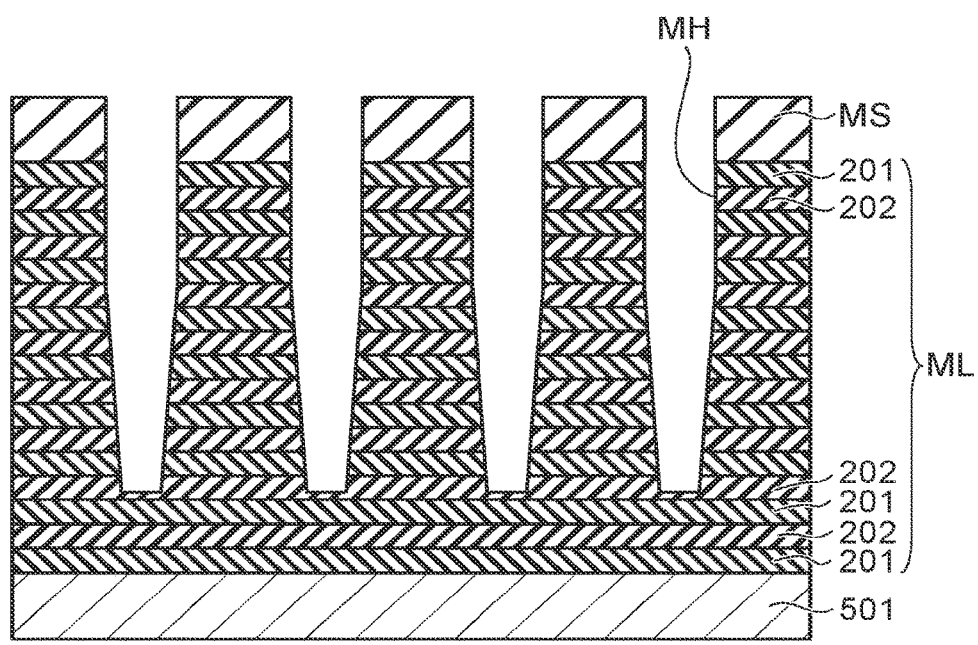
Figure 6:
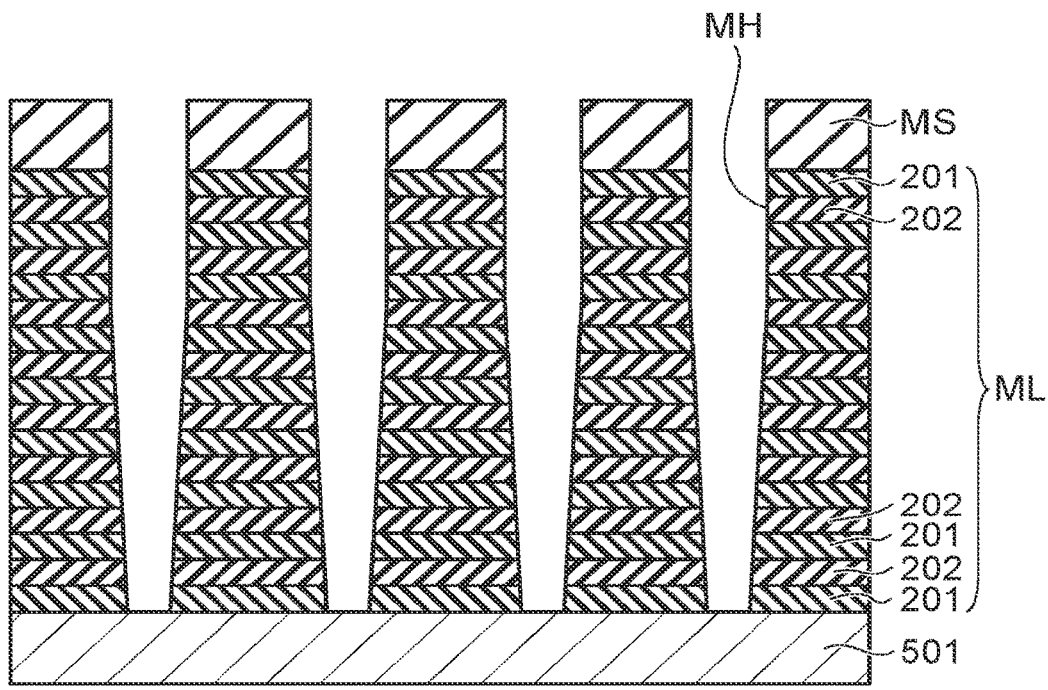

As shown in FIG. 4 to FIG. 6, etching treatment such as RIE is applied to the stacked body ML using the resist patterns MS as a mask. Consequently, memory holes MH are formed.

The formation of the memory holes MH is performed in the treatment chamber 101 shown in FIG. 1. The stacked body ML is set on the holding table 105. The etching gas is supplied to the treatment chamber 101 from the gas supply system 103 at a predetermined flow rate. The pump 104 exhausts gas such the etching gas from the treatment chamber 101. The control unit 108 controls to actuate the high-frequency source 110. Consequently, an electric field is generated between the holding table 105 and the dielectric plate 109. The etching gas is converted into plasma by the electric field. The stacked body ML is etched by ion species or radical species in the plasma.

Figure 7:
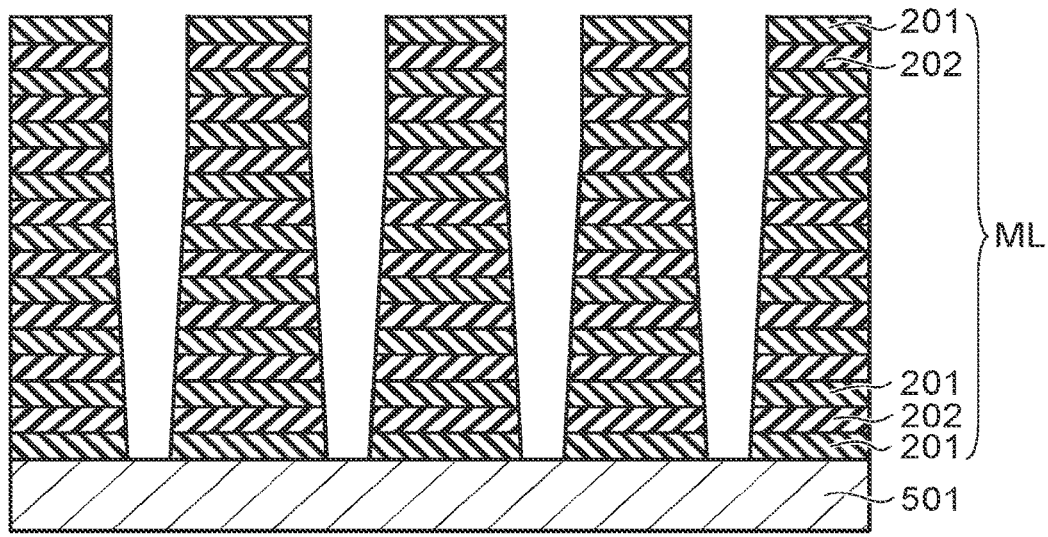

As shown in FIG. 7, the resist patterns MS remaining on the stacked body ML are removed.

Figure 8:
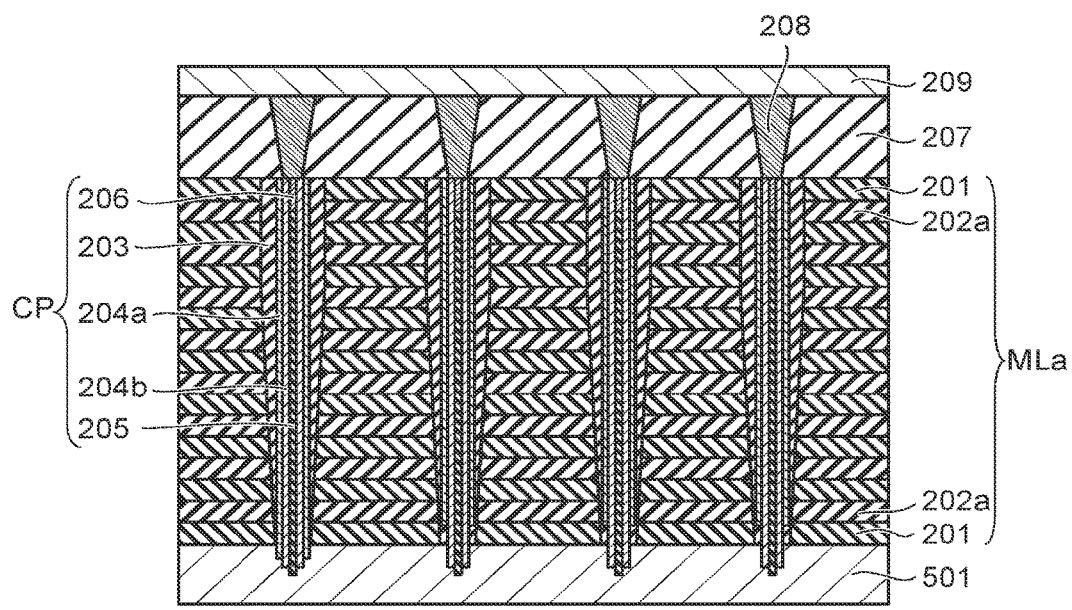

As shown in FIG. 8, memory films 203 are formed on exposed surfaces of the stacked body ML and on the upper surface of the substrate 501 in the memory holes MH. The memory films 203 are, for example, stacked films of block insulating films, charge storage films, and tunnel insulating films. In the stacked films, the block insulating films, the charge storage films, and the tunnel insulating films are provided in this order on the inner surfaces of the memory holes MH.

When a voltage within a range of a driving voltage of the integrated circuit device is applied to the block insulating films, an electric current substantially does not flow in the block insulating films. The charge storage films have an ability to retain electric charges. When a predetermined voltage within the range of the driving voltage of the integrated circuit device is applied to the tunnel insulating films, a tunnel current flows in the tunnel insulating films.

The block insulating films and the tunnel insulating films contain, for example, silicon oxide. The charge storage films contain, for example, silicon nitride.

Cover films 204a are formed on the inner surfaces of the memory films 203. A part of the memory films 203 and the cover films 204a on the substrate 501 in the memory holes MH are removed. Consequently, the upper surface of the substrate 501 is exposed in the memory holes MH.

Thereafter, channel films 204b are formed on the memory holes MH. As the cover films 204a and the channel films 204b, for example, a semiconductor material such as amorphous silicon is used. The channel films 204b are electrically connected to the substrate 501.

Insulating materials are provided on the inner surfaces of the channel films 204b. Consequently, core oxidizing members 205 are formed in the memory holes MH. In the memory holes MH, semiconductor layers 206 are formed on the core oxidizing members 205. As the semiconductor layers 206, for example, silicon is used. The silicon contains impurities (e.g., arsenide (As)) serving as a donor.

Consequently, in the memory holes MH, columnar sections CP including the memory films 203, the cover films 204a, the channel films 204b, the core oxidizing films 205, and the semiconductor layers 206 are formed.

The first films 202 are removed by being etched via slits (not shown in the figure) formed in other portions of the stacked body ML. Conductive films 202a are formed in spaces in which the first films 202 are removed. Consequently, the stacked body ML changes to a stacked body MLa.

Thereafter, an insulating film 207 is formed on the stacked body MLa. Plugs 208 piercing through the insulating film 207 are formed in regions right above the semiconductor layers 206. The plugs 208 are electrically connected to the semiconductor layers 206.

Thereafter, interconnects 209 are formed on the insulating film 207. The interconnects 209 are electrically connected to the plugs 208.

According to the process described above, the integrated circuit device is manufactured.

An example of the integrated circuit device manufactured using the manufacturing apparatus 100 for the integrated circuit device according to the embodiment is described.

FIG. 9 is a perspective view illustrating the integrated circuit device.

As shown in FIG. 9, the substrate 501 is provided in an integrated circuit device 300.

In FIG. 9, one direction parallel to a major surface of the substrate 501 is represented as an X-direction. A direction parallel to the major surface of the substrate 501 and perpendicular to the X-direction is represented as a Y-direction. A direction perpendicular to the X-direction and the Y-direction is represented as a Z-direction.

On the substrate 501, the stacked body MLa, a plurality of columnar sections CP, and separating sections ST are provided. The stacked body MLa includes a plurality of insulating films 201 and a plurality of conductive films 202a. In the stacked body MLa, the plurality of insulating films 201 and the plurality of conductive films 202a are alternately disposed (stacked) in the Z-direction.

The columnar sections CP are formed in a columnar shape or a flat columnar shape (including an elliptical columnar shape) extending in the Z-direction in the stacked body MLa. The separating sections ST are formed in a tabular shape extending along an XY plane in the stacked body MLa. The stacked body MLa is divided in the Y-direction by the separating sections ST.

The interconnects 209 are provided on the stacked body MLa. The plugs 208 are provided between the columnar sections CP and the interconnects 209. The columnar sections CP are electrically connected to the interconnects 209 via the plugs 208.

For example, holes for forming the columnar sections CP can be formed by the manufacturing apparatus 100 for the integrated circuit device according to the embodiment.

An example of the operation of the manufacturing apparatus 100 for the integrated circuit device according to the embodiment is described with reference to the formation of the memory holes MH shown in FIG. 4 to FIG. 6 as an example.

In the example described below, in the stacked body ML in which the memory holes MH are formed, the number of insulating films 201 is eighteen and the number of first films 202 is eighteen. In the stacked body ML, the insulating films 201 and the first films 202 are alternately stacked.

When the stacked body ML is etched, light emission occurs according to the etching. For example, reaction products are generated according to the etching. Light emission occurs in the generated reaction products. For example, when a film containing silicon nitride is etched, cyan (CN) is generated as one of reaction products. In this case, a maximum light emission wavelength of the cyan (CN) is approximately 390 nm.

An example is described below in which the light emission intensity of the cyan (CN) is detected by the photosensor 107.

Figure 10:
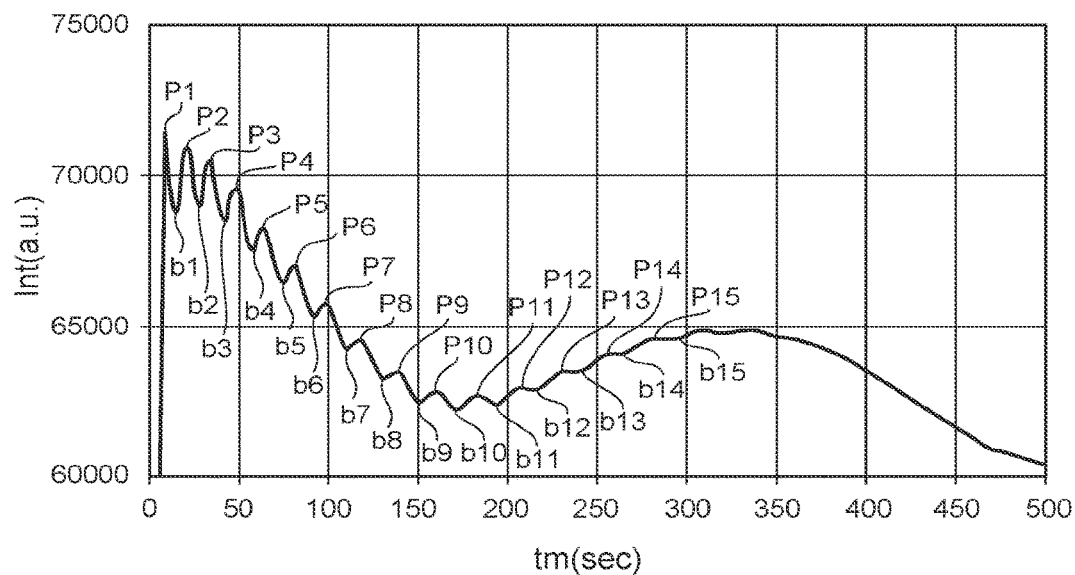
FIG. 10 is a graph illustrating a temporal change in light intensity.

FIG. 10 is a graph illustrating a temporal change in light intensity.

In FIG. 10, the abscissa indicates time tm (second) and the ordinate indicates light intensity Int (any unit) at a wavelength of 390 nm.

In this example, the stacked body ML includes the insulating films 201 containing silicon oxide and the first films 202 containing silicon nitride. As shown in FIG. 10, in this case, a light emission wavelength changes according to a progress state of etching.

The light intensity at the wavelength of 390 nm at the time when the first films 202 are mainly etched is higher than the light intensity at the wavelength of 390 nm at the time when the insulating film 201 is mainly etched.

When a temporal change in light emission intensity at the wavelength of 390 nm is detected while the stacked body ML is etched, a waveform repeating an increase and a decrease is obtained as spectrum data of the light emission intensity. In a spectrum of the light emission intensity, a plurality of extreme values are observed.

the plurality of extreme values are, for example, peak values (convex values: a peak P1 to a peak P15). The number of peak values corresponds to the number of etched first films 202. It is possible to learn a progress degree of the etching in the stacked body ML from the number of extreme values. The plurality of extreme values may be bottom values (concave values: a bottom b1 to a bottom b15). The number of bottom values corresponds to, for example, the number of etched insulating films 201.

For example, detection of a fourth peak corresponds to etching of the first film 202 in an eighth layer from the top film of the stacked body ML.

As shown in FIG. 10, as the etching treatment advances, the width of the increase and the decrease in the spectrum of the light emission intensity decreases. When holes having a high aspect ratio are formed in the stacked body ML, a decrease in the width of the increase and the decrease is conspicuous. In the latter half of the etching treatment, detection of peak values is sometimes difficult. In this case, it is difficult to determine an end point on the basis of the number of extreme values For example, the width of the increase and the decrease of the spectrum of the light emission intensity in the former half of the etching treatment shown in FIG. 4 is smaller than the width of the increase and the decrease of the spectrum of the light emission intensity in the latter half of the etching treatment shown in FIG. 5.

For example, in FIG. 10, detection of peaks corresponding to the first films 202 in lower layers than the peak P9 is more difficult than detection of a peak corresponding to the first film 202 corresponding to the peak P9. For example, detection of peaks corresponding to the first films 202 lower than the first film 202 corresponding to the peak P15 is difficult.

in the manufacturing apparatus 100 for the integrated circuit device according to the embodiment, the control unit 108 is provided. The control unit 108 derives an estimated time to an end point, for example, even when extreme values cannot be detected in the latter half of the etching treatment.

An example of a method of deriving an estimated time to an end point is described below. This derivation is performed by, for example, the control unit 108.

An etching time of a "predetermined layer" in an upper side portion of the stacked body ML is represented as T(xL). In the "predetermined layer", it is easy to detect extreme values from a spectrum of light emission intensity. An etching time in "any layer" provided below the "predetermined layer" is represented as T(yL). The "any layer" provided below the "predetermined layer" is a y-th layer from the "predetermined layer" (y is an integer equal to or larger than 1). The etching time T (yL) is an etching time of one "any layer". In this case, a relation between T(xL) and T(yL) is represented by the following Formula (1):

$$T(yL) = \alpha_{(y-1)} \times T(xL) \quad (1)$$

Therefore, an etching time (Z) from the "predetermined layer" to the "any layer" (the y-th layer) is represented by the following Formula (2):

$$Z = T(xL) + \alpha_1 T(xL) + \alpha_2 T(xL) + \alpha_3 T(xL) + \ldots + \alpha_{(y-1)} T(xL) \quad (2)$$

In Formula (2), $\alpha(\alpha_1$ to $\alpha_{(y-1)})$ is a correction coefficient. A value of the correction coefficient changes according to, for example, the depth of holes (the memory holes MH, etc.).

For example, in the stacked body ML, it is assumed that the respective thicknesses of the plurality of insulating films 201 and the respective thicknesses of the plurality of first films 202 are fixed. In this case, the correction coefficient $\alpha(\alpha_1$ to $\alpha_{(y-1)})$ changes at a fixed rate.

The respective thicknesses of the plurality of insulting layers 201 may change in the stacking direction. The respective thicknesses of the plurality of first films 202 may change in the stacking direction.

For example, a rate of change in the stacking direction of the respective thicknesses of the plurality of insulating layers 201 may change at a fixed rate. In this case, the correction coefficient $\alpha(\alpha_1$ to $\alpha_{(y-1)})$ changes at the fixed rate.

For example, a rate of change in the stacking direction of the respective thicknesses of the plurality of first layers 202 may change a fixed rate. In this case, the correction coefficient $\alpha(\alpha_1$ to $\alpha_{(y-1)})$ changes at the fixed rate.

The rate of change of the respective thicknesses in the stacking direction of the plurality of insulating layers 201 or the plurality of first layers 202 may be changed, for example, exponentially. In this case, the correction coefficient $\alpha(\alpha_1$ to $\alpha_{(y-1)})$ changes exponentially.

The rate of change of the respective thicknesses in the stacking direction of the plurality of insulating layers 201 or the plurality of first layers 202 may be changed, for example, at a rate represented by a polynomial. In this case, the correction coefficient $\alpha(\alpha_1$ to $\alpha_{(y-1)})$ changes at the rate represented by the polynomial.

The rate of change of the respective thicknesses in the stacking direction of the plurality of insulating layers 201 or the plurality of first layers 202 may be changed, for example, at a rate represented by a logarithm equation. In this case, the correction coefficient $\alpha(\alpha_1$ to $\alpha_{(y-1)})$ changes at the rate represented by the logarithm equation.

The rate of change of the respective thicknesses in the stacking direction of the plurality of insulating layers 201 or the plurality of first layers 202 may be changed, for example, at a rate represented by a power expression. In this case, the correction coefficient $\alpha(\alpha_1$ to $\alpha_{(y-1)})$ changes at the rate represented by the power expression.

When the thicknesses of the plurality of insulating films 201 are irregularly different and when the thicknesses of the plurality of first films 202 are irregularly different, correction corresponding to the thicknesses of the films is applied. Consequently, the derived correction coefficient $\alpha(\alpha_1$ to $\alpha_{(y-1)})$ changes at the fixed rate.

For example, in Formula (2), if the etching times T(xL), $\alpha_1 T(xL)$, and $\alpha_2 T(xL)$ can be grasped, it is possible to perform an estimated calculation of an etching time $\alpha_3 T(xL)$ and a subsequent etching time $\alpha_{(y-1)} T(xL)$. Consequently, it is possible to estimate the etching time Z to the "any layer".

Figure 11:
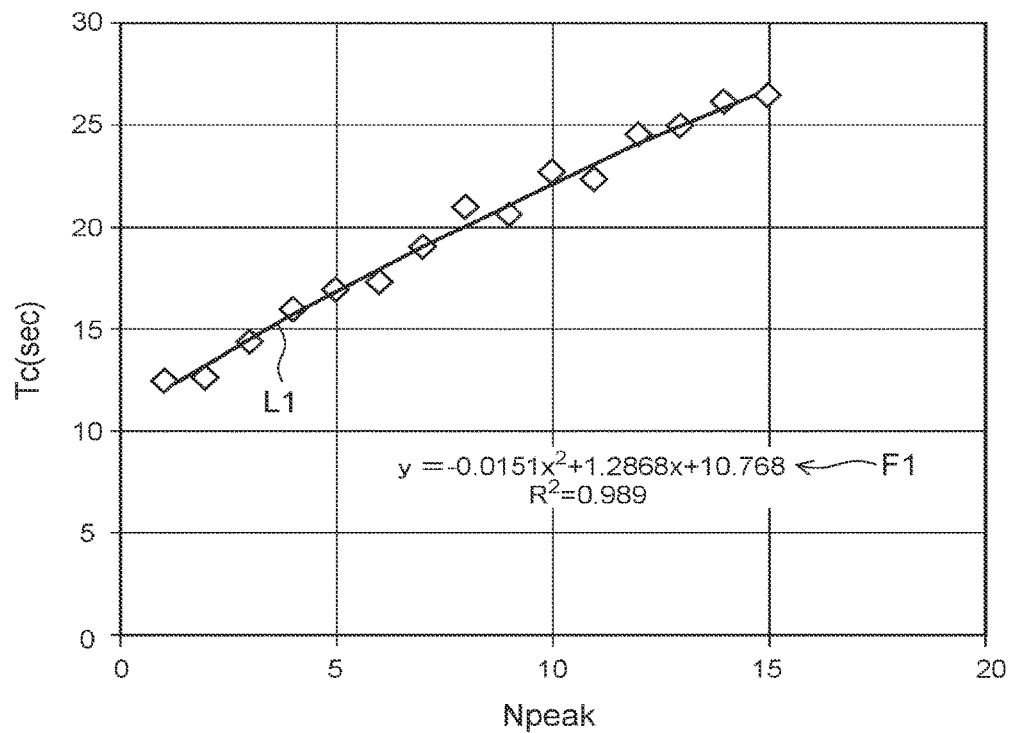
FIG. 11 is a graph illustrating a relation between the number of detected peaks and time.

FIG. 11 is a graph illustrating a relation between the number of detected peaks and time.

In FIG. 11, the abscissa indicates the number of detected peaks Npeak and the ordinate indicates time Tc (second) among a plurality of peak values. That is, the time Tc is time equivalent to one cycle of the plurality of peak values (a cycle time).

As shown in FIG. 11, a relation between a cycle time of a plurality of extreme values (peak values) and the number of detected extreme values (peak values) coincides with a predetermined approximation formula (in FIG. 11, an approximation formula F1) well. An approximate line L1 is an approximate line derived from the approximation formula F1.

It is possible to estimate the etching time Z to any layer using the predetermined approximation formula F1.

for example, at any time halfway in etching, an approximation formula is derived on the basis of data of detected extreme values (peak values). It is possible to estimate, from the approximation formula, time until detection of extreme values (peak values) not detected yet at that point.

For example, in FIG. 11, a cycle time ($Y_{16}$) of a sixteenth peak can be estimated assuming that x in the approximation formula F1 is 16. That is, the cycle time ($Y_{16}$) of the sixteenth peak is represented by the following Formula (3):

$$Y_{16} = -0.0151 \times 16^2 + 1.2868 \times 16 + 10.768 \quad (3)$$

An example of the operation of the control unit 108 is described below.

In the embodiment, the control unit 108 detects a plurality of extreme values (e.g., peak values) from spectrum data of acquired light emission intensity. The control unit 108 derives an approximation formula from a relation between the number of detected extreme values (peak values) and a time interval of the plurality of extreme values (peak values).

The control unit 108 estimates, using the approximation formula, progress of etching in a lower side portion (a portion close to the substrate 501) where detection of extreme values (peak values) is difficult.

As the approximation formula, for example, one approximation formula selected from a group consisting of a linear approximation formula, a polynomial approximation formula, a logarithmic approximation formula, an exponential approximation formula, and a power approximation formula. The progress of the etching may be estimated by combining results derived from one or more approximation formulas selected from a group of the approximation formulas.

The control unit 108 calculates, from the obtained approximation formula, a cycle of extreme values (peak values) estimated to be detected. Thereafter, the control unit 108 derives, from the obtained cycle, an estimated time to a predetermined end point. When the derived time comes, the control unit 108 causes the etching apparatus to end the etching treatment.

The control unit 108 carries out the etching treatment, for example, in steps described below.

Figure 12:
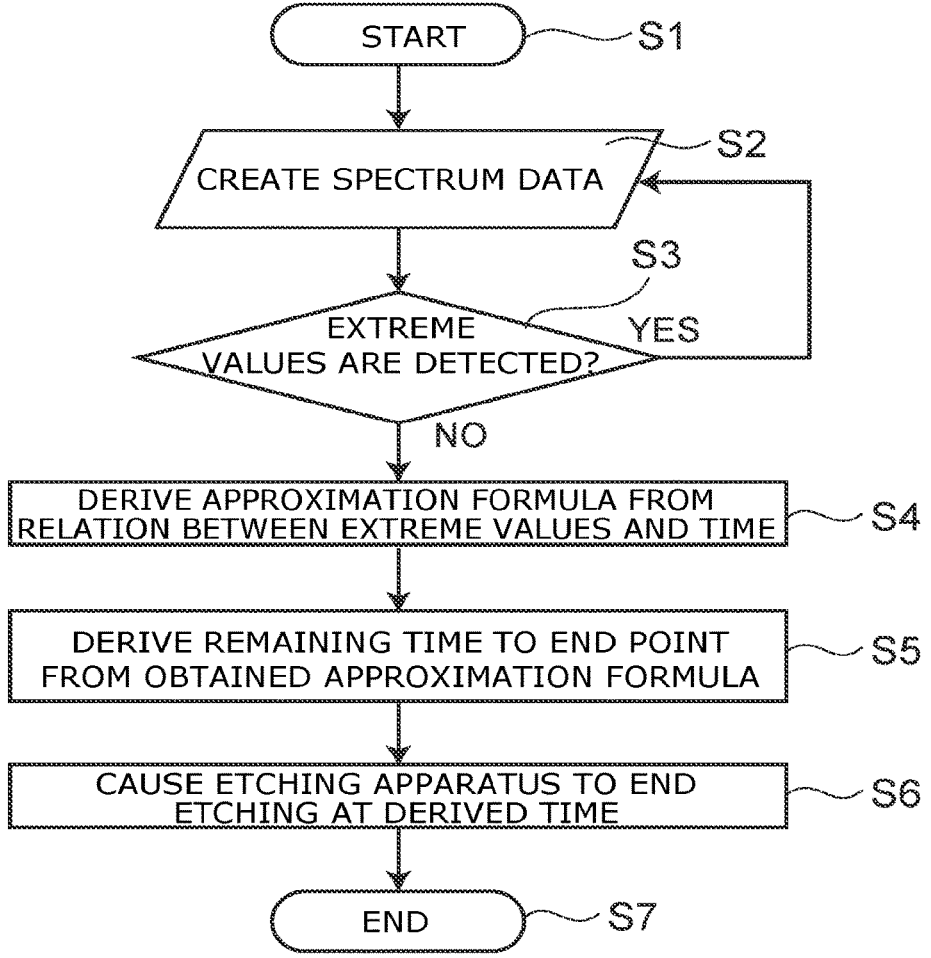
FIG. 12 is a flowchart illustrating operation processing of the control unit.

FIG. 12 is a flowchart illustrating operation processing of the control unit.

As shown in FIG. 12, the control unit 108 causes an etching apparatus to start the etching treatment (step S1). The control unit 108 acquires data of light emission intensity detected by a sensor and creates spectrum data of the light emission intensity. That is, the control unit 108 creates data concerning a temporal change in the light emission intensity (step S2). The control unit 108 attempts detection of extreme values from the data concerning the temporal change in the light emission intensity. The extreme values are, for example, peak values (step S3). When the detection of the extreme values is possible in step S3, the control unit 108 carries out the process of step S2 again. When the extreme values cannot be detected, a control unit 108 derives an approximation formula from a relation between a plurality of extreme values obtained to that point and time (step S4). Consequently, the control unit 108 derives a cycle from a time interval of the plurality of extreme values. The control unit 108 derives, according to the approximation formula, an estimated time to a predetermined end point on the basis of the derived period (step S5). The control unit 108 causes the etching apparatus to end the etching treatment at the derived estimated time (step S6).

According to the steps described above, the control unit 108 causes the etching apparatus to carry out the etching treatment.

The control unit 108 may set the end point in any position of the stacked body ML. Further, after causing the etching apparatus to end the etching treatment, the control unit 108 may further etch the stacked body ML under other conditions.

In the manufacturing apparatus for the integrated circuit device according to the embodiment, an estimated time to an end point in the etching treatment is derived on the basis of data of light emission intensity. This makes it easy to determine an end point even in etching treatment with a high aspect ratio with respect to the stacked body ML. Consequently, it is possible to suppress fluctuation in sizes of holes and the like formed in a workpiece. It is also possible to suppress fluctuation in a processing amount of a substrate.

The operation of the control unit 108 described in the embodiment can be executed on the basis of a computer program, which is software. A general-purpose computer system stores the computer program in advance and reads the computer program, whereby it is also possible to obtain effects same as the effects by the manufacturing apparatus 100 for the integrated circuit device of the embodiment described above. The instructions described in the embodiment are recorded in, as a computer program executable by a computer, a magnetic disk (a flexible disk, a hard disk, etc.), an optical disk (a CD-ROM, a CD-R, a CD-RW, a DVD-ROM, a DVD±R, a DVD±RW, etc.), a semiconductor memory, or a recording medium similar to these. A storage form of the recording medium may be any form as long as the recording medium can be read by the computer or an embedded system. If the computer reads the computer program from the recording medium and causes, on the basis of the computer program, a CPU to execute the instructions described in the computer program, it is possible to realize an operation same as the operation of the manufacturing apparatus of the embodiment described above. Naturally, when the computer acquires or reads the computer program, the computer may acquire or read the computer program through a network.

An OS (operating system) running on the computer, database management software, MW (middleware) operating in the network, or the like may execute a part of the kinds of processing for realizing the embodiment on the basis of the instructions of the computer program installed in the computer or the embedded system from the recording medium.

Further, the recording medium of the embodiment is not limited to a recording medium independent from the computer or the embedded system and includes a recording medium in which the computer program transmitted by a LAN, the Internet, or the like is downloaded and stored or temporarily stored. The recording medium is not limited to one recording medium. When the processing of the embodiment is executed from a plurality of recording media, the recording media are included in the recording medium of the embodiment. The configuration of the recording medium may be any configuration.

Note that the computer of the embodiment is a computer for executing the kinds of processing of the embodiment on the basis of the computer program stored in the recording medium. The computer may be any configuration such as an apparatus configured by one personal computer, microcomputer, or the like or a system in which a plurality of apparatuses are connected by a network.

The computer of the embodiment is not limited to the personal computer and includes an arithmetic processing apparatus and a microcomputer included in information processing apparatuses. The computer is a general term of devices and apparatuses capable of realizing the functions of the embodiment according to the computer program.

A reference example is described.

The reference example is a manufacturing apparatus for an integrated circuit device in which the control unit 108 that estimates an end point is not provided. The manufacturing program according to the embodiment is not implemented in the manufacturing apparatus for the integrated circuit device according to the reference example.

In the processing of the stacked body ML, when an aperture ratio of the memory holes MH is low, a sufficient change in the intensity of a light emission waveform is not obtained before memory holes MH reach the substrate 501.

On the other hand, when the aperture ratio of the memory holes MH is high, a cyclic change in the light emission waveform occurs before memory holes MH reach the substrate 501.

The manufacturing apparatus for the integrated circuit device according to this reference example determines an end point from a state of decrease in the light emission intensity. Therefore, in the case described above, it is difficult to accurately control the etching treatment.

In the integrated circuit device shown in FIG. 9, when the etching treatment such as RIE ends before reaching the substrate 501, the substrate and the semiconductor pillars are not connected. Therefore, a manufactured device is defective.

On the other hand, when an etching treatment time continues for a while even after the etching treatment reaches the substrate 501, a processing amount of the substrate increases. Consequently, since an electric path is extended, a manufactured device is defective.

According to the embodiment described above, it is possible to realize a manufacturing apparatus for an integrated circuit device, a manufacturing program for an integrated circuit device, and a manufacturing method for an integrated circuit device that suppress fluctuation in sizes in etching treatment. Further it is possible to realize a nontransitory computer readable medium storing a program for manufacturing an integrated circuit device that suppress fluctuation in sizes in etching treatment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. An apparatus for manufacturing an integrated circuit device comprising:
   an etching treatment unit configured to etch a stacked body including an alternately arranged plurality of films having different compositions, the etching treatment unit including
      a housing configured to define a treatment chamber,
      a gas supply system configured to supply an etching gas to the treatment chamber,
      a pump configured to exhaust gas in the treatment chamber,
      a holding table configured to hold the stacked body in the treatment chamber,
      a dielectric place provided above the holding table, and
      a high frequency source configured to generate an electric field between the holding table and the dielectric place;
   a sensor configured to detect light intensity of one wavelength of a light emission generated by etching reaction during the etching; and
   a control unit configured to
      detect extreme values from data relating to a temporal change in the light intensity detected by the sensor,
      determine an end point of the etching based on the extreme values while the extreme values can be detected,
      estimate an end point of the etching based on the extreme values detected so far when the extreme value cannot be detected from the data at all, and
      cause the etching treatment unit to stop the etching when the end point is reached, the extreme values including at least one of a plurality of peak values and a plurality of bottom values, wherein
   the control unit is configured to estimate the end point by deriving a cycle from a time interval of the plurality of extreme values, and to estimate time to the end point of the etching based on the time interval,
   the control unit is configured to determine an etching amount after reaching a lower layer by estimating a time to the end point based on the temporal change in the light intensity during the etching, and
   the time interval is derived based on an approximation formula derived from a relation between a number of the extreme values and time in the data.

2. The apparatus according to claim 1, wherein the approximation formula includes one formula selected from a group consisting of a linear approximation formula, a polynomial approximation formula, a logarithmic approximation formula, an exponential approximation formula, and a power approximation formula.

3. An apparatus for manufacturing an integrated circuit device comprising:
   an etching treatment unit configured to etch a stacked body including an alternately arranged plurality of films having different compositions;
   a sensor configured to detect light intensity of one wavelength of a light emission generated by etching reaction during the etching; and
   a control unit configured to
      detect extreme values from data relating to a temporal change in the light intensity detected by the sensor while the extreme values can be detected,
      estimate a time to an end point of the etching based on a cycle from a time interval etching and a number of the plurality of films of the stacked body while the extreme values cannot be detected at all, and
      cause the etching treatment unit to stop the etching when the time to the end point has passed, each of the cycles from time intervals being a time between adjacent extreme values.

4. The apparatus according to claim 3, wherein the control unit is configured to estimate the time to the end point of the etching, wherein the data includes a later time period during which an amplitude of one or more of the extreme values from the data is less than a detection limit of the control unit.

5. The apparatus according to claim 3, wherein the stacked body includes a plurality of first films and a plurality of second films, each of the plurality of first films and each of the plurality of second films are stacked alternately.

* * * * *